(12) United States Patent
Yang et al.

(10) Patent No.: US 6,403,488 B1
(45) Date of Patent: *Jun. 11, 2002

(54) SELECTIVE SAC ETCH PROCESS

(75) Inventors: Chan-Lon Yang, Los Gatos, CA (US); Dan Arnzen, Eden Prairie, MN (US); Jim Nulty, San Jose, CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,991

(22) Filed: Feb. 22, 1999

Related U.S. Application Data

(60) Provisional application No. 60/079,319, filed on Mar. 19, 1998.

(51) Int. Cl.[7] .............................................. H01L 21/461
(52) U.S. Cl. ........................ 438/706; 438/710; 438/712; 438/714
(58) Field of Search ................................ 438/706, 710, 438/712, 714; 252/79.1, 79.3, 79.4

(56) References Cited

U.S. PATENT DOCUMENTS

| | | | | |
|---|---|---|---|---|
| 4,581,101 A | * | 4/1986 | Senoue et al. .............. | 156/643 |
| 5,266,154 A | * | 11/1993 | Tatsumi ....................... | 156/643 |
| 5,326,431 A | * | 7/1994 | Kadomura ................ | 156/659.1 |
| 5,338,399 A | * | 8/1994 | Yanagida .................... | 156/662 |
| 5,376,228 A | * | 12/1994 | Yanagida .................... | 156/651 |
| 5,376,234 A | * | 12/1994 | Yanagida .................... | 156/662 |
| 5,445,712 A | * | 8/1995 | Yanagida .................... | 156/662 |
| 5,468,342 A | | 11/1995 | Nulty et al. ............. | 156/643.1 |
| 5,562,801 A | | 10/1996 | Nulty ...................... | 156/643.1 |
| 5,811,357 A | * | 9/1998 | Armacost et al. ........... | 438/723 |
| 5,817,579 A | * | 10/1998 | Ko et al. .................... | 438/740 |
| 5,874,013 A | * | 2/1999 | Tokunaga et al. ............. | 216/67 |
| 5,904,566 A | * | 5/1999 | Tao et al. ................... | 438/689 |
| 5,928,967 A | * | 7/1999 | Radens et al. .............. | 438/740 |
| 5,942,446 A | * | 8/1999 | Chen et al. ................. | 438/734 |
| 5,948,701 A | * | 9/1999 | Chooi et al. ................ | 438/694 |
| 5,962,347 A | * | 10/1999 | Tokunaga et al. ........... | 438/728 |
| 5,976,766 A | * | 11/1999 | Kasuga et al. ............. | 430/313 |
| 6,017,826 A | * | 1/2000 | Zhou et al. ................. | 438/720 |
| 6,080,648 A | * | 6/2000 | Nagashima ................. | 438/592 |

* cited by examiner

*Primary Examiner*—Benjamin L. Utech
*Assistant Examiner*—Vanessa Perez-Ramos
(74) *Attorney, Agent, or Firm*—Christopher P. Maiorana, P.C.

(57) ABSTRACT

A method for plasma etching, comprising etching a structure with a plasma prepared from a gas mixture comprising: (i) an etching gas, and (ii) a strained cyclic (hydro)fluorocarbon gas, has a high etch selectivity of oxide versus nitride, and is particularly useful in a SAC etch process.

21 Claims, No Drawings

SELECTIVE SAC ETCH PROCESS

This application claims the benefit of U.S. Provisional Application No. 60/079,319, filed Mar. 19, 1998.

BACKGROUND OF THE INVENTION

1. Field of the Invention

The present invention relates to a method of plasma etching, a method of forming a plasma and an etching gas composition.

2. Discussion of the Background

A specific application of plasma etching involves etching of a composite substrate in which the stack of a semiconductor device formed on a semiconductor substrate is encased in a first dielectric material such as a silicon nitride having a lower etch rate under conditions which typically etch a bulk dielectric layer such as a silicon oxide which overlies the first dielectric material. Using a technique known as self-aligned contact (SAC) etching, a patterned photoresist is formed, leaving openings overlying a region in the semiconductor device to which an opening is desired. When typical plasma etching conditions are conducted, etching of the bulk dielectric material occurs quite easily, while etching of the first dielectric material is relatively slow, such that even if there is a minor misalignment of the photolithographic mask, formation of an opening to the desired region, without damaging the device stack is possible.

However, high etch selectivity between the first and bulk dielectric materials is more difficult to obtain at smaller contact hole sizes of <0.35 $\mu$m, and at a high aspect ratio (i.e. >4:1) contact hole.

Nulty U.S. Pat. No. 5,468,342 reports a method of etching openings in an oxide layer in which 1,1,1,2-tetrafluoroethane (HFC 134a) is used as an additive to an etchant gas, allowing for improved oxide:nitride selectivity. This mixture offers improved oxide:nitride selectivity relative to $CHF_3$, however such selectivity decreases when forming higher aspect ratio contact openings, and smaller dimension contact holes.

Nulty U.S. Pat. No. 5,562,801, reports a hard mask etching process in which 1,1,1,2-tetrafluoroethane is an additive to the etchant gas to improve oxide:nitride selectivity.

Marks et al U.S. Pat. No. 5,423,945, report an increase in the oxide:nitride etching selectivity by introduction of a scavenger for fluorine, such as a source of silicon ions or graphite. Etchant gases such as $CF_4$, $C_2F_6$ and $C_3F_8$ are reported.

Collins et al U.S. Pat No. 5,300,460, report a plasma-assisted etching process in which a power source having a frequency range of from 50–800 MHz is used.

Blalock et al U.S. Pat. No. 5,286,344, report a selective etch process in which a fluorinated chemical etch system is used comprising an etchant material and an additive material comprising a fluorocarbon material in which the number of hydrogen atoms is equal to or greater than the number of fluorine atoms.

Tahara et al U.S. Pat. Nos. 5,302,236 and 5,356,515, report an etching process of an object having an oxide or nitride portion by a gas plasma containing a halogen element with a gas containing both carbon in an oxidation state less than 4 and oxygen.

Yanagida U.S. Pat. No. 5,376,234, reports a dry etching method in which the etchant gas comprises a compound selected from mercaptan, thioether and disulfide having a fluorocarbon side chain, as effective for reducing the deposit of polymer.

Present etching methods do not provide entirely satisfactory result when etching small contact holes ( e.g. <4.0 $\mu$m) and at a high aspect ratio (e.g. 4:1). Increasing demands on miniaturization as device density for integrated circuits increases are pushing the limits of existing etching technology. Accordingly, improved methods for selectively etching an oxide layer are sought.

SUMMARY OF THE INVENTION

One aspect of the present invention is directed to a method of plasma etching a dielectric layer.

Another embodiment of the present invention is directed to a method of forming a plasma.

Another embodiment of the present invention is directed to a plasma etching gas.

These and other aspects of the present invention are made possible by an etching process in which a mixture of first and, optionally second (hydro)fluorocarbon additive gases are added to an etching gas for a plasma etching process. Applicants have discovered that this mixture enhances the selectivity of oxide etching over nitride etching. A (hydro)fluorocarbon gas is a gas which optionally contains hydrogen, and does contain fluorine and carbon.

DETAILED DESCRIPTION OF THE PREFERRED EMBODIMENTS

The first (hydro)fluorocarbon additive gas may be any strained cyclic (hydro)fluorocarbon, which is a carbon containing, fluorine containing compound which also contains a strained ring, and optionally contains hydrogen. Preferably, the compound has a vapor pressure of at least 10 mTorr at 100° C. Preferably the compound contains 2–20 carbon atoms. Preferably the ring is a three-member or four-member ring which includes only carbon atoms, but one or more heteratoms, such as an oxygen atom or a nitrogen atom, is possible. The ring may contain double or triple bonds, and ring larger than three- or four-member ring may have significant ring strain if they contain double or triple bond, however, saturated compounds are preferred. A preferred group of compound have the formula $C_aF_bH_cR_d$, where a=3 or 4, b+c+d=2a and the total number of carbon atoms is 3–10; and each R is individually $—C_eF_fH_g$, where f+g=2e+1, b, c, d, e, f and g are all positive integers, or zero and f+b>0. Preferably e is 0–6, more preferably 0–2. Preferably, the first (hydro)fluorocarbon is c-$C_4F_8$, c-$C_3F_6$ or c-$C_3F_5(CF_3)$, or mixtures thereof (where "c" means cyclic). In a preferred embodiment, the additive gas is c-$C_4F_8$. The amount of strained cyclic (hydro)fluorocarbon gas is preferably 2–4 SCCM.

As an optional second (hydro)fluorocarbon additive gas, 1,1,1,2-tetrafluoroethane may be used. The amount of second (hydro)fluorocarbon additive gas, such as 1,1,1,2-tetrafluoroethane, may be 1–20 SCCM, more preferably 5–15 SCCM, even more preferably about 12 SCCM. The second (hydro)fluorocarbon additive gas may be selected to improve the oxide/nitride selectivity of the etching process.

As the reactive or etching gas, a halocarbon may be used such as $CHF_3$, $CH_2F_2$, $CHF_2CF_3$, $C_2F_6$, and mixtures thereof. Additional halocarbons include $CF_4$, $SF_6$, $NF_3$, $SF_4$, $Cl_2$, HF, HCl, $CCl_4$, $C_nH_xF_y$ (where n$\geq$1, y$\geq$1, and x+y= 2n+2) and mixtures thereof, preferably $CHF_3$. Preferably the halocarbon has a vapor pressure at 100° C. of at least 10 mTorr. Preferably, the halocarbon contains 1–20 carbon atoms. Within the context of the present invention the term "etching gas" refers to the components of the gas which produce etching of the dielectric and flow rates of etching gases describe herein do not include the flow of first and second (hydro)fluorocarbon additive gases or make up gases. In a preferred embodiment, the etching gas is $CHF_3$. The amount of etching gas used is 20–60 SCCM, more preferably 25–47 SCCM, more preferably about 25 SCCM.

The etching gas may also comprise an inert make-up/carrier gas such as Ar, Xe or He.

CO may be formed during the etching process, but preferably CO is not added to the gas mixture. If present, CO should be present in an amount of less that 5 vol. %, preferably less than 1 vol. %, more preferably less than 0.1 vol. %, even more preferably less than 0.01 vol. % and most preferably less than 0.001 vol. %.

Suitable bulk dielectric layers to be etches are those conventionally known in the art. Non-limiting examples of suitable bulk dielectric layers include a $SiO_2$ based layer such as silicon dioxide (which may be conventionally doped with boron and/or phosphorous; e.g. borophosphosilicate glass (BPSG), borosilicate glass (BSG), and phosphosilicate glass (PSG), a conventional oxide/nitride/oxide structure, low K dielectrics such as $SiO_2$ doped with either F, Cl or both, spin-on glass (SOG), a silicon oxynitride (e.g. of the general formula $[Si_aO_xN_y]$ such that $(x/2)+(3y/4)=a$), $Al_2O_3$, $V_2$, $O_5$, tetraethylorthosilicate (TEOS)-based oxides which may be doped with boron (B) and/or phosphorous (P) (such as BPTEOS films), and titanium oxide, aluminum oxynitrides (e.g. of the general formula $[Al_bO_xN_y]$ such that $(2x/3)+y=b$), aluminosilicates and nitrides thereof (e.g. of the general formula $[Si_aAl_bO_xN_y]$) where $4a+3b=2x+3y$, and boron- and/or phosphorous-doped aluminates and aluminosilicates. More preferably the dielectric layer is $SiO_2$ or $SiO_2$ doped with boron (B) and/or phosphorous (P). In a most preferred embodiment, the dielectric material is a BPTEOS film.

When the bulk dielectric material is BPTEOS, the dielectric layer may further comprise a capping layer prepared from TEOS, which can act to stabilize the BPTEOS layer during processing and/or prevent etching and/or migration of dopants from the BPTEOS layer into a subsequently deposited layer. When present, a capping layer may be etched in a first stage, under optimum etching conditions which are not necessarily the optimum etching conditions for the underlying BPTEOS layer.

The thickness of the bulk dielectric film is not particularly limited and is preferably 0.1–5 $\mu$m.

The bulk dielectric layer to be etched may overlie an underlying conductive region such as a semiconductor substrate, a source or drain region, the gate material of the gate electrode, or a conductive material. Non-limiting examples of suitable conductive regions include a metal such as aluminum, polysilicon (which may be conventionally doped with n-dopants such a phosphorous, arsenic, antimony, sulfur, etc. or with p-dopants such as boron), titanium, tungsten, copper, conductive alloys thereof such as aluminum-copper and titanium-tungsten alloy, etc., and conductive compounds, such as tungsten silicide or may directly overly the gate of a device or a device stack.

Generally, an opening through a dielectric exposing a diffusion region or an opening through a dielectric layer between (a) a semiconductor substrate or a polysilicon layer and (b) the first metal layer is called a "contact opening", while an opening in other oxide layers such as an opening through an intermetal dielectric layer is referred to as a "via" or "via channel". As used herein, an "opening" will be understood to refer to any type of opening through any type of dielectric layer, regardless of the layer exposed or the function of the opening. Furthermore, a "(semi)conductive layer" refers to a layer of either a conventional semiconductive material (that may be conventionally doped) or a conventional conductive material.

Disposed in between the bulk dielectric and the underlying conductive region is a first dielectric layer which is resistant to etching under the conditions used to etch the bulk dielectric material. The first dielectric layer typically comprises silicon nitride (e.g., $Si_3N_4$), metal nitrides such as aluminum nitride (e.g. AlN) or tantalum nitride (e.g., $Ta_3N_5$ or TaN).

The surface of the dielectric layer may be patterned with a photoresist. Suitable photoresist materials are those conventionally known to those of ordinary skill in the art and may comprise either positive or negative photoresist materials. Either or both positive and/or negative resist layers may be used.

The photoresist may be applied by conventional methods known to those of ordinary skill in the art. Non-limiting examples of suitable techniques for applying a photoresist will include spraying, roller coating and spin coating. In a preferred embodiment, spin coating is used to deposit the photoresist film. The thickness of the photoresist material may vary depending upon the application. However, generally a resist having a thickness of at least 500 nm, more preferably 700 nm to 1.5 $\mu$m, is used.

Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation of suitable negative resist materials is within the level of skill of one of ordinary skill in the art without undue experimentation. Specific non-limiting examples of suitable negative resist systems include cresol epoxy novolac-based negative resists as well as negative resists containing the photoreactive polymers described in Kirk-Othmer Encyclopedia of Chemical Technology, 3rd Edition, vol 17, entitled "Photoreactive Polymers", pages 680–708, the relevant portions of which are hereby incorporated by references.

Positive resists have photoreactive components which are destroyed in the regions exposed to light. Typically the resist is removed in an aqueous alkaline solution, where the exposed region dissolves away. The preparation of suitable positive resist materials is within the level of skill of one of ordinary skill in the art without undue experimentation. Specific non-limiting examples of suitable positive resist systems include Shipley XP9402, JSR KRK-K2G and JSR KRF-L7 positive resists as well as positive resists containing the photoreactive polymers described in Kirk-Othmer Encyclopedia of Chemical Technology, 3rd Edition, vol 17, entitled "Photoreactive Polymers", pages 680–708, the relevant portions of which are hereby incorporated by references.

Exemplary resist materials are also described by Baver et al, IBM Tech. Discl. Bull. (USA) vol. 22, No. 5, (October 1979), pp. 1855; Tabei, U.S. Pat. No. 4,613,404; Taylor et al, J. Vac. Sci., Technol. B. Vol. 13, No. 6, (1995), pp. 3078–3081; Argritis et al, J. Vac. Sci., Technol. B., Vol. 13, No. 6, (1995), pp. 3030–3034; Itani et al, J. Vac. Sci, Technol. B. Vol 13, No. 6, (1995), pp. 3026–3029; Ohfuli et al, J. Vac. Sci, Technol. B. Vol. 13, No. 6, (1995), pp. 3022–3025; Trichkov et al, J. Vac. Sci., Technol. B. Vol. 13, No. 6, (1995), pp. 2986–2993; Capodieci et al, J. Vac. Sci, Technol. B. Vol. 13, No. 6, (1995), pp. 2963–2967; Zuniga et al, J. Vac. Sci, Technol. B. Vol. 13, No. 6, (1995), pp. 2957–2962; Xiao et al, J. Vac. Sci, Technol. B. Vol. 13, No. 6, (1995), pp. 2897–2903; Tan et al J. Vac. Sci, Technol. B. Vol. 13, No. 6, (1995), pp. 2539–2544; and Mayone et al J. Vac. Sci, Technol. Vol. 12, No. 6, pp. 1382–1382. The relevant portions of the above-identified references which describe the preparation of resist materials are hereby incorporated by reference. Specific examples of resist materials are JSR and Mitsubishi resist materials.

It is also within the scope of the present invention to use an adhesion enhancing agent in the photoresist material to promote the adhesion of the photoresist to the underlying dielectric material. The adhesion enhancing agent may be added to the photoresist material or may be applied as a separate layer between the photoresist and the underlying dielectric material layer. Such adhesion enhancing agents include those conventionally known to those of ordinary skill in the art.

Patterning and developing of the resist material may be conducted by conventional methods known to those of ordinary skill in the art. In a preferred embodiment, after patterning and developing but prior to plasma etching, hard baking of the resist may be conducted by conventional methods known to those of ordinary skill in the art. Hard baking is typically performed sufficiently to prevent photoresist lifting from the underlying dielectric layer during wet etching, for example for about 30 minutes—1 hour at a temperature of 110–120° C., more specifically about 40 minutes at 115°.

Plasma etching conditions are those typically used for conducting plasma etching of an oxide layer, known to those of ordinary skill in the art. For example, the pressure may be 50–1000 mTorr, preferably 55–500 mTorr, more preferably 60–200 mTorr; the RF power may be 200–1500 W, preferably 300–1000 W, more preferably 400–800 W; the magnetic field may be 0–50 Gauss, preferably 2–30 Gauss, more preferably 5–20 Gauss. As a specific example, the pressure may be 90 mTorr, the RF power 600 W and the magnetic field 10 Gauss. When $CHF_3$ is used as the etching gas, a flow rate of 0–200 SCCM may be used, preferably 10–100 SCCM, more preferably 15–50 SCCM. When $C_2H_2F_4$ (HFC 134a) is used as the second (hydro)flurocarbon additive gas, the flow rate may be 1–50 SCCM, preferably 5–30 SCCM, more preferably 8–20 SCCM. When c-$C_4F_8$ is used as the strained cyclic (hydro)fluorocarbon gas, the flow rate may be 0–50 SCCM, preferably 0.1–30 SCCM, more preferably 0.2–20 SCCM. When Ar is used an inert make-up/carrier gas, the flow rate may be 0–500 SCCM, preferably 10–400 SCCM, more preferably 20–250 SCCM. When $CF_4$ is used as an etching gas, or as an additional halocarbon gas, the flow rate may be 0–100 SCCM, preferably 0–30 SCCM, more preferably 0–20 SCCM. As a specific example, the following gasses and flow rates may be used: $CHF_3$ at 25 SCCM; $C_2H_2F_4$ (HFC134a) at 12 SCCM; c-$C_4F_8$ at 2 SCCM; Ar at 100 SCCM; and $CF_4$ at 0 SCCM.

A suitable length of time for etching is an amount of time which is sufficient to achieve the desired etch result, for example etching through the entire bulk dielectric layer, or 10–20% more time than necessary to etch through the bulk dielectric layer to insure complete etching of the oxide without significant or damaging etching of other materials. An appropriate amount of time for etching may be determined empirically by plotting time versus the amount of material etched for each set of etch conditions. Over etching (the amount of time beyond that necessary to etch through the bulk dielectric layer) may be from 0–200%. The etch rate is preferably 2000–10,000 Å/min. In a typical SAC etch process, the etch rate is about 4200 Å/min, and a typical over-etching is about 50%.

Non-limiting examples of dry isotropic etch machines include CTI Drytek (available from DRYTEK, Inc. of Wilmington, Mass., and Santa Clara, Calif.,) and Aspen Lite Etch (available from Mattson Technology, Inc. of Fremont, Calif.). Dry etching may also be conducted by conventional RF or dual RF etching. In a preferred embodiment, etching is conducted using a commercially available plasma etcher and a $CHF_3/C_2F_6$ etching gas chemistry (together with a first strained cyclic (hydro)fluorocarbon additive gas) according to the manufacturer's instructions. For example, the invention may be practiced with a conventional diode, triode, magnetic enhanced reactive ion etcher (MERIE), microwave etching apparatus or HDP (High Density Plasma) reactor; in one embodiment the present invention is practiced on a Drytek Triode 384T system, e.g. from DRYTEK, Inc. of Wilmington, Mass., and Santa Clara, Calif.

Suitable powers for etching include an RF power of 150 to 1,000 W, preferably 200 to 800 W, more preferably 300 to 600 W. In a dual RF embodiment (i.e. wherein the plasma is formed at a first relatively low radio frequency and, simultaneously, a second, relatively high radio frequency; see e.g. U.S. Pat. No. 5,441,596), the low frequency power maybe from 400 to 1,000 W, preferably 500 to 900 W, more preferably 525 to 850 W, and the high frequency power may be from 100 to 600 W, preferably 100 to 500 W, more preferably 150 to 475 W.

The aspect ratio of the contact formed is preferably >3:1, even more preferably >3.5:1, even more preferably >4:1.

The size of the opening formed is preferably less than 0.4 $\mu$m, more preferably less than 0.35 $\mu$m, even more preferably less than 0.3 $\mu$m.

Obviously, numerous modifications and variations of the present invention are possible in light of the above teachings. It is therefore to be understood that within the scope of the appended claims, the invention may be practiced otherwise than as specifically described herein.

What is claimed is:

1. A method for plasma etching, comprising etching a structure with a plasma prepared from a gas mixture comprising:
   (i) an etching gas selected from the group consisting of $NF_3$, $Cl_2$, HF, HCl, $CCl_4$ and $C_nH_xF_y$ (where n=2–10, x≧1, y≧1, and x+y=2n+2),
   (ii) a strained cyclic (hydro)fluorocarbon gas, and
   (iii) a second (hydro)fluorocarbon gas, other than said etching gas.

2. The method of claim 1, wherein said gas mixture comprises 1,1,2-tetrafluoroethane.

3. The method of claim 1, wherein said strained cyclic (hydro)fluorocarbon is a compound having the formula $C_aF_bH_cR_d$, where a=3 or 4; b+c+d=2a; the total number of carbon atoms in the compound is 3–10; and each R is individually —$C_eF_fH_g$, where f+g=2e+1; b, c, d, e, f and g are all positive integers, or zero; and f+b>0.

4. The method of claim 1, wherein said strained cyclic (hydro)fluorocarbon gas is at least one gas selected from the group consisting of c-$C_4F_8$, c-$C_3F_6$ and c-$C_3F_5$ ($CF_3$).

5. The method of claim 1, wherein said strained cyclic (hydro)fluorocarbon gas comprises c-$C_4F_8$.

6. The method of claim 1, wherein said second (hydro)fluorocarbon gas is at least one gas selected from the group consisting of $CHF_3$, $CH_2F_2$, $CHF_2CF_3$, $C_2F_6$, $CF_4$, and $C_2H_2F_4$.

7. The method of claim 1, wherein said structure comprises:
   (a) a first dielectric material,
   (b) a bulk dielectric material, on said first dielectric material, and
   (c) a photoresist pattern on said bulk dielectric material.

8. The method of claim 7, wherein said first dielectric material comprises silicon nitride.

9. The method of claim 7, wherein said bulk dielectric material comprises silicon dioxide.

10. The method of claim 7, wherein said bulk dielectric comprises BPSG.

11. The method of claim 4, wherein said gas mixture comprises 1,1,1,2-tetrafluoroethane;
   said structure comprises:
      (a) a first dielectric material containing silicon and nitrogen,
      (b) a bulk dielectric material containing silicon and oxygen, on said first dielectric material, and
      (c) a photoresist pattern on said bulk dielectric material; and
   said etching gas comprises $CHF_3$.

12. A method of forming an etching plasma, comprising striking a plasma in a gas mixture comprising:
   (i) an etching gas selected from the group consisting of $NF_3$, $Cl_2$, HF, HCl, $CCl_4$ and $C_nH_xF_y$ (where n=2–10, x≧1, y≧1, and x+y=2n+2),
   (ii) a strained cyclic (hydro)fluorocarbon gas, and
   (iii) a second (hydro)fluorocarbon gas, other than said etching gas.

13. The method of claim 12, wherein said gas mixture comprises 1,1,1,2-tetrafluoroethane.

14. The method of claim 12, wherein said strained cyclic (hydro)fluorocarbon gas is at least one gas selected from the group consisting of c-$C_4F_8$, c-$C_3F_6$ and c-$C_3F_5$ ($CF_3$).

15. The method of claim 12, wherein said strained cyclic (hydro)fluorocarbon gas comprises c-$C_4F_8$.

16. The method of claim 12, wherein said second (hydro)fluorocarbon gas is at least one gas selected from the group consisting of $CHF_3$, $CH_2F_2$, $CHF_2CF_3$, $C_2F_6$, $CF_4$, and $C_2H_2F_4$.

17. A gas mixture for plasma etching, comprising:
   (i) an etching gas selected from the group consisting of $NF_3$, $Cl_2$, HF, HCl, $CCl_4$ and $C_nH_xF_y$ (where n=2–10, x≧1, y≧1, and x+y=2n+2),
   (ii) a strained cyclic (hydro)fluorocarbon gas, and
   (iii) a second (hydro)fluorocarbon gas, other than said etching gas.

18. The gas mixture of claim 17, comprises 1,1,1,2-tetrafluoroethane.

19. The gas mixture of claim 17, wherein said strained cyclic (hydro)fluorocarbon gas is at least one gas selected from the group consisting of c-$C_4F_8$, c-$C_3F_6$ and c-$C_3F_5$ ($CF_3$).

20. The gas mixture of claim 17, wherein said strained cyclic (hydro)fluorocarbon gas comprises c-$C_4F_8$.

21. The gas mixture of claim 17, wherein said second (hydro)fluorocarbon gas is at least one gas selected from the group consisting of $CHF_3$, $CH_2F_2$, $CHF_2CF_3$, $C_2F_6$, $CF_4$, and $C_2H_2F_4$.

* * * * *